US012641849B2

(12) United States Patent
Breil et al.

(10) Patent No.: US 12,641,849 B2
(45) Date of Patent: May 26, 2026

(54) LOW TEMPERATURE N-TYPE CONTACT EPI FORMATION

(71) Applicant: Applied Materials, Inc., Santa Clara, CA (US)

(72) Inventors: Nicolas Breil, Alviso, CA (US); Matthew Cogorno, Sunnyvale, CA (US); Anchuan Wang, San Jose, CA (US); Byeong Chan Lee, San Jose, CA (US); Manoj Vellaikal, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 444 days.

(21) Appl. No.: 18/121,718

(22) Filed: Mar. 15, 2023

(65) Prior Publication Data

US 2023/0307506 A1 Sep. 28, 2023

Related U.S. Application Data

(60) Provisional application No. 63/322,275, filed on Mar. 22, 2022.

(51) Int. Cl.
*H10D 64/01* (2025.01)
*C23C 16/24* (2006.01)
(Continued)

(52) U.S. Cl.
CPC ............. *H10D 64/01* (2025.01); *C23C 16/24* (2013.01); *C23C 16/52* (2013.01); *C23C 16/56* (2013.01);
(Continued)

(58) Field of Classification Search
None
See application file for complete search history.

(56) References Cited

U.S. PATENT DOCUMENTS 4,498,951 A * 2/1985 Tamura ............... H01L 21/2636
148/DIG. 123
4,799,991 A * 1/1989 Dockrey ........... H01L 21/32137
438/719
(Continued)

FOREIGN PATENT DOCUMENTS

JP 2009076907 A 4/2009
WO 2021003031 A1 1/2021

OTHER PUBLICATIONS

PCT International Search Report and Written Opinion in PCT/US2023/015432 dated Jul. 3, 2023, 10 pages.
(Continued)

*Primary Examiner* — Erik T. K. Peterson
(74) *Attorney, Agent, or Firm* — SERVILLA WHITNEY LLC

(57) ABSTRACT

Methods for forming a semiconductor structure and semiconductor structures are described. The method comprises non-selectively depositing an amorphous silicon layer on a top surface and a sidewall surface of at least one contact trench on a substrate and a crystalline silicon layer on a bottom surface of the at least one contact trench at a temperature less than or equal to 400° C., the bottom surface including a source/drain material. The amorphous silicon layer is selectively removed from the top surface and the sidewall surface at a temperature less than or equal to 400° C. The method may be performed in a processing chamber without breaking vacuum.

15 Claims, 3 Drawing Sheets

(51) Int. Cl.

| | | |
|---|---|---|
| *C23C 16/52* | (2006.01) | |
| *C23C 16/56* | (2006.01) | |
| *H10D 62/83* | (2025.01) | |
| *H10D 64/62* | (2025.01) | |
| *H10P 50/24* | (2026.01) | |

(52) U.S. Cl.
CPC ........... *H10P 50/242* (2026.01); *H10D 62/83* (2025.01); *H10D 64/0113* (2026.01); *H10D 64/62* (2025.01)

(56) References Cited

U.S. PATENT DOCUMENTS

| | | | |
|---|---|---|---|
| 6,194,037 B1 * | 2/2001 | Terasaki | C23C 16/5096 |
| | | | 427/579 |
| 6,274,920 B1 * | 8/2001 | Park | H10D 84/00 |
| | | | 257/E21.022 |
| 7,646,046 B2 | 1/2010 | Russ et al. | |
| 9,263,278 B2 * | 2/2016 | Purayath | H01J 37/32357 |
| 11,189,730 B2 * | 11/2021 | Glass | H10D 64/01 |
| 2005/0136605 A1 * | 6/2005 | Murto | H10D 64/668 |
| | | | 438/303 |
| 2007/0042569 A1 * | 2/2007 | Dip | H01L 21/02532 |
| | | | 257/E21.31 |
| 2007/0224766 A1 * | 9/2007 | Rachmady | H10D 30/0275 |
| | | | 257/E21.309 |

| | | | |
|---|---|---|---|
| 2007/0287272 A1 | 12/2007 | Bauer et al. | |
| 2011/0124169 A1 * | 5/2011 | Ye | H01L 21/02532 |
| | | | 257/E21.431 |
| 2011/0151674 A1 * | 6/2011 | Tang | H01J 37/32357 |
| | | | 438/715 |
| 2011/0294300 A1 * | 12/2011 | Zhang | H01L 21/31116 |
| | | | 438/719 |
| 2012/0210932 A1 | 8/2012 | Hekmatshoar-Tabari | |
| 2012/0295427 A1 * | 11/2012 | Bauer | H10D 62/021 |
| | | | 438/494 |
| 2014/0264612 A1 | 9/2014 | Cheng et al. | |
| 2015/0318212 A1 | 11/2015 | Tsai et al. | |
| 2017/0092721 A1 * | 3/2017 | Chi | H10D 62/10 |
| 2017/0207103 A1 * | 7/2017 | Kal | H01L 21/0337 |
| 2018/0230624 A1 * | 8/2018 | Dube | H01L 21/67207 |
| 2018/0350668 A1 | 12/2018 | Cheng et al. | |
| 2018/0350936 A1 | 12/2018 | Balakrishnan et al. | |
| 2021/0098584 A1 | 4/2021 | Cheng et al. | |
| 2021/0119037 A1 | 4/2021 | Li et al. | |
| 2021/0143278 A1 | 5/2021 | Wang et al. | |

OTHER PUBLICATIONS

"Dry Etching for VLSI Fabrication", Silicon Processing for the VLSI Era, vol. 1, Jan. 1986, pp. 539-585, XP001041254.
Beyer, et al., "Alternative Gases and Processes for Amorphous and Microcrystalline Silicon Etching", 3rd World Conference on Photovoltaic Energy Conversion, May 11-18, 2003, p. 1584.

* cited by examiner

<u>10</u>

<u>100</u>

100

100

LOW TEMPERATURE N-TYPE CONTACT EPI FORMATION

CROSS-REFERENCE TO RELATED APPLICATIONS

This application claims priority to U.S. Provisional Application No. 63/322,275, filed Mar. 22, 2022, the entire disclosure of which is hereby incorporated by reference herein.

TECHNICAL FIELD

Embodiments of the present disclosure pertain to the field of semiconductor devices and semiconductor device manufacturing. More particularly, embodiments of the disclosure relate to integrated methods for n-type contact formation.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

The transistor is a key component of most integrated circuits. Since the drive current, and therefore speed, of a transistor is proportional to the gate width of the transistor, faster transistors generally require larger gate width. Thus, there is a trade-off between transistor size and speed, and "fin" field-effect transistors (finFETs) have been developed to address the conflicting goals of a transistor having maximum drive current and minimum size. FinFETs are characterized by a fin-shaped channel region that greatly increases the size of the transistor without significantly increasing the footprint of the transistor, and are now being applied in many integrated circuits. However, finFETs have their own drawbacks.

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (finFET) structure, and a gate all around (GAA) structure. Logic gate performance is related to the characteristics of the materials used as well as the thickness and area of the structural layers. However, as some gate characteristics are adjusted to accommodate device scaling, challenges arise.

In order to form an n-type contact, one may use an n-type epitaxial layer growth after the contact trench has been etched. For this epitaxial layer, a multi-step (multi being comprised of between one to five cycles) cyclic process is used to selectively form an n-type contact. The throughput of this cyclic process is determined by the tradeoff between the deposition rate and the selective amorphous silicon etch rate. Lower temperature results in a reduction in both deposition rate and etch rate, so the cyclic process needs to occur at a temperature of at least 470° C. Accordingly, there is a need in the art for methods of forming n-type contacts at lower temperature.

SUMMARY

One or more embodiments of the disclosure are directed to a method of forming a semiconductor device. The method comprises non-selectively depositing an amorphous silicon layer on a top surface and a sidewall surface of at least one feature on a substrate and a crystalline silicon layer on a bottom surface of the at least one feature at a temperature less than or equal to 400° C.; and selectively removing the amorphous silicon layer from the top surface and the sidewall surface at a temperature less than or equal to 400° C., wherein the method is performed in a processing chamber without breaking vacuum.

Another embodiment of the disclosure is directed to a method of forming a logic device. The method comprises non-selectively depositing an amorphous silicon layer on a top surface and a sidewall surface of at least one contact trench on a substrate and a crystalline silicon layer on a bottom surface of the at least one contact trench at a temperature less than or equal to 400° C., the bottom surface including a source/drain material; and selectively removing the amorphous silicon layer from the top surface and the sidewall surface at a temperature less than or equal to 400° C., wherein the method is performed in a processing chamber without breaking vacuum.

Further embodiments of the disclosure are directed to a processing tool. The processing tool comprises a pre-clean chamber having a substrate support therein; a non-selective silicon deposition chamber; a selective etching chamber; a robot configured to access the pre-clean chamber, the non-selective deposition chamber, and the selective etching chamber; and a controller connected to the pre-clean chamber, the non-selective deposition chamber, and the selective etching chamber, the controller having one or more configurations selected from: cleaning a substrate, non-selectively forming an amorphous silicon layer and a crystalline silicon layer, and selectively etching the substrate, wherein the non-selective deposition chamber and the selective etching chamber are continuously kept under vacuum.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of the disclosure and are therefore not to be considered limiting of its scope, for the disclosure may admit to other equally effective embodiments.

Figure 1:
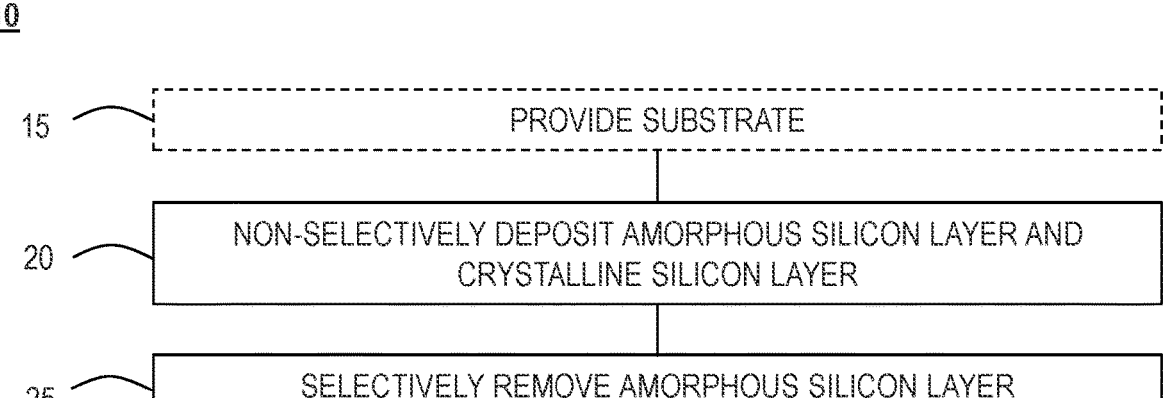
FIG. 1 illustrates a process flow diagram of a method in accordance with one or more embodiments of the disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

As used herein, the term "substrate," refers to a surface, or portion of a surface, upon which a process acts. It will also be understood by those skilled in the art that reference to a substrate can also refer to only a portion of the substrate unless the context clearly indicates otherwise. Additionally, reference to depositing on a substrate can mean both a bare substrate and a substrate with one or more films or features deposited or formed thereon.

Additionally, the term "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, dielectric materials, other conductive materials, or combinations thereof, depending on the application. In some embodiments, the substrate comprises silicon (Si), ruthenium (Ru), cobalt (Co), tungsten (W), silicon phosphide (SiP), titanium silicon (TiSi), titanium nitride (TiN), titanium aluminide (TiAl), silicon germanium (SiGe), silicon germanium boron (SiGeB), hafnium oxide ($HfO_2$), aluminum oxide ($Al_2O_3$) or combinations thereof. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates.

According to one or more embodiments, the term "on", with respect to a film or a layer of a film, includes the film or layer being directly on a surface, for example, a substrate surface, as well as there being one or more underlayers between the film or layer and the surface, for example the substrate surface. Thus, in one or more embodiments, the phrase "on the substrate surface" is intended to include one or more underlayers. In other embodiments, the phrase "directly on" refers to a layer or a film that is in contact with a surface, for example, a substrate surface, with no intervening layers. Thus, the phrase "a layer directly on the substrate surface" refers to a layer in direct contact with the substrate surface with no layers in between.

As used herein, the term "substrate surface" refers to any substrate surface upon which a layer may be formed. The substrate surface may have one or more features formed therein, one or more layers formed thereon, and combinations thereof. The shape of the feature can be any suitable shape including, but not limited to, peaks, trenches, and cylindrical vias. As used in this regard, the term "feature" refers to any intentional surface irregularity. Suitable examples of features include but are not limited to trenches which have a top, two sidewalls and a bottom, peaks which have a top and two sidewalls extending upward from a surface, and vias which have sidewalls extending down from a surface with an open bottom.

As used herein, the term "processing chamber" includes portions of a processing chamber adjacent to the substrate surface without encompassing the complete interior volume of the processing chamber. For example, in a sector of a spatially separated processing chamber, the portion of the processing chamber adjacent the substrate surface is purged of one or more reactive compounds by any suitable technique including, but not limited to, moving the substrate through a gas curtain to a portion or sector of the processing chamber that contains none or substantially none of the reactive compounds.

As used herein, the term "atomic layer deposition" or "cyclical deposition" refers to the sequential exposure of two or more reactive compounds to deposit a layer of material on a substrate surface. The substrate, or portion of the substrate surface is exposed sequentially to the two or more reactive compounds which are introduced into a reaction zone of a processing chamber. The sequential exposure of the reactive gases prevents or minimizes gas phase reactions between the reactive gases. In a time-domain ALD process, exposure to each reactive compound is separated by a time delay to allow each compound to adhere and/or react on the substrate surface. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay a purge gas, such as argon, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the desired thickness. In one or more embodiments, the time-domain ALD process can be performed with more than two reactive compounds in a predetermined sequence.

In an aspect of a spatial ALD process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas. In one or more embodiments, the spatial ALD process can be performed with more than two reactive compounds in a predetermined sequence.

In some embodiments, the substrate surface is exposed to the first reactive compound and the second reactive compound substantially sequentially. As used herein throughout the specification, "substantially sequentially" means that most of the duration of the first reactive compound exposure does not overlap with the second reactive compound exposure, although there may be some overlap.

As used herein, the term "chemical vapor deposition" refers to the exposure of at least one reactive compound to deposit a layer of material on the substrate surface. In some embodiments, the chemical vapor deposition (CVD) process comprises mixing the two or more reactive compounds in the processing chamber to allow gas phase reactions of the reactive compounds and deposition. In some embodiments, the CVD process comprises exposing the substrate surface to two or more reactive compounds simultaneously. In some embodiments, the CVD process comprises exposing the substrate surface to a first reactive compound continuously with an intermittent exposure to a second reactive compound. In some embodiments, the substrate surface undergoes the CVD reaction to deposit a film having a predetermined thickness. In the CVD process, the film can be deposited in one exposure to the mixed reactive compounds, or can be multiple exposures to the mixed reactive compounds with purges between. In some embodiments, the substrate surface is exposed to the first reactive compound and the second reactive compound substantially simultaneously.

As used herein throughout the specification, "substantially simultaneously" means that most of the duration of the first reactive compound exposure overlaps with the second reactive compound exposure.

As used herein, the term "purging" includes any suitable purge process that removes unreacted precursor, reaction products and by-products from the process region. The suitable purge process includes moving the substrate through a gas curtain to a portion or sector of the processing region that contains none or substantially none of the reactant. In one or more embodiments, purging the processing chamber comprises applying a vacuum. In some embodiments, purging the processing region comprises flowing a purge gas over the substrate. In some embodiments, the purge process comprises flowing an inert gas. In one or more embodiments, the purge gas is selected from one or more of nitrogen ($N_2$), helium (He), and argon (Ar). In some embodiments, the first reactive compound is purged from the reaction chamber for a time duration in a range of from 0.2 seconds to 30 seconds, from 0.2 seconds to 10 seconds, from 0.2 seconds to 5 seconds, from 0.5 seconds to 30 seconds, from 0.5 seconds to 10 seconds, from 0.5 seconds to 5 seconds, from 1 seconds to 30 seconds, from 1 seconds to 10 seconds, from 1 seconds to 5 seconds, from 5 seconds to 30 seconds, from 5 seconds to 10 seconds or from 10 seconds to 30 seconds before exposing the substrate to the second reactive compound.

As used herein, the terms "liner" or "barrier layer" refer to a layer conformably formed along at least a portion of the sidewalls and/or lower surface of an opening such that a substantial portion of the opening prior to the deposition of the layer remains unfilled after deposition of the layer. The liner may be formed along the entirety of the sidewalls and lower surface of the opening. The liner can be formed by any process known to a person skilled in the art. In some embodiments, the liner comprises a metal nitride, a PVD metal or combinations thereof.

Transistors are circuit components or elements that are often formed on semiconductor devices. Many transistors may be formed on a semiconductor device in addition to capacitors, inductors, resistors, diodes, conductive lines, or other elements, depending upon the circuit design. The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals.

Generally, a transistor includes a gate formed between source and drain regions. The source and drain regions may include a doped region of a substrate and may exhibit a doping profile suitable for a particular application. The gate is positioned over the channel region and may include a gate dielectric interposed between a gate electrode and the channel region in the substrate.

As used herein, the term "field effect transistor" or "FET" refers to a transistor that uses an electric field to control the electrical behavior of the device. Field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity. Conventionally, current entering the channel at the source (S) is designated Is and current entering the channel at the drain (D) is designated ID. Drain-to-source voltage is designated VDS. By applying voltage to gate (G), the current entering the channel at the drain (i.e., ID) can be controlled.

The metal-oxide-semiconductor field-effect transistor (MOSFET) is a type of field-effect transistor (FET) and is used in integrated circuits and high-speed switching applications. MOSFET has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they are both of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p-type substrate region. If the MOSFET is a p-channel or pMOS FET, then the source and drain are p+ regions and the body is a n-type substrate region. The source is so named because it is the source of the charge carriers (electrons for n-channel, holes for p-channel) that flow through the channel; similarly, the drain is where the charge carriers leave the channel.

A nMOS FET, is made up of an n-type source and drain and a p-type substrate. When a voltage is applied to the gate, holes in the body (p-type substrate) are driven away from the gate. This allows forming an n-type channel between the source and the drain and a current is carried by electrons from source to the drain through an induced n-type channel.

Logic gates and other digital devices implemented using NMOSs are said to have NMOS logic. There are three modes of operation in a NMOS called the cut-off, triode, and saturation. Circuits with NMOS logic gates dissipate static power when the circuit is idling, since DC current flows through the logic gate when the output is low.

A pMOS FET is made up of p-type source and drain and an n-type substrate. When a positive voltage is applied between the source and the gate (negative voltage between gate and source), a p-type channel is formed between the source and the drain with opposite polarities. A current is carried by holes from source to the drain through an induced p-type channel. A high voltage on the gate will cause a PMOS not to conduct, while a low voltage on the gate will cause it to conduct. Logic gates and other digital devices implemented using PMOS are said to have PMOS logic. PMOS technology is low cost and has good noise immunity.

In a NMOS, carriers are electrons, while in a PMOS, carriers are holes. When a high voltage is applied to the gate, NMOS will conduct, while PMOS will not. Furthermore, when a low voltage is applied in the gate, NMOS will not conduct and PMOS will conduct. NMOS are considered to be faster than PMOS, since the carriers in NMOS, which are electrons, travel twice as fast as holes, which are the carriers in PMOS. But PMOS devices are more immune to noise than NMOS devices. Furthermore, NMOS ICs would be smaller than PMOS ICs (that give the same functionality), since the NMOS can provide one-half of the impedance provided by a PMOS (which has the same geometry and operating conditions).

As used herein, the term "fin field-effect transistor (Fin-FET)" refers to a MOSFET transistor built on a substrate where the gate is placed on two, three, or four sides of the channel or wrapped around the channel, forming a double gate structure. FinFET devices have been given the generic name FinFETs because the source/drain region forms "fins" on the substrate. FinFET devices have fast switching times and high current density.

As used herein, the term "gate all-around (GAA)," is used to refer to an electronic device, e.g., a transistor, in which the gate material surrounds the channel region on all sides. The channel region of a GAA transistor may include nanowires or nano-slabs or nano-sheets, bar-shaped channels, or other suitable channel configurations known to one of skill in the art. In one or more embodiments, the channel region of a GAA device has multiple horizontal nanowires or horizontal bars vertically spaced, making the GAA transistor a stacked horizontal gate-all-around (hGAA) transistor.

Embodiments of the disclosure provide semiconductor structures and methods for forming a semiconductor structure. In one or more embodiments, an n-type contact EPI (SiP) at lower temperature (400° C. or below) is desired for NMOS source/drain contact EPI formation with a replacement metal gate scheme, because the replacement metal gate is formed before contact EPI. At temperatures less than 400° C., the current baseline 2-step cyclic process has no selectivity because the amorphous silicon selective etch-back rate is almost zero. Thus, there is amorphous silicon on the sidewall and top of contact trench which needs to be removed afterwards. At 400° C. to 500° C., the amorphous silicon etch back rate is very slow and causes the etch time to be several hours. Such throughput is unacceptable for customers. Thus, in one or more embodiments, an integrated solution for n-type contact EPI formation at low temperature (<400° C.) with reasonable throughput is advantageously provided. One or more embodiments provide a selective etch process to selectively etch amorphous SiP versus crystalline SiP at low temperature (400° C. or below), for better etch rate and process optimization. In one or more embodiments, a non-selective low temperature n-type SiP EPI and selective etch is integrated in one cluster tool system for better throughput and to allow cyclic processes. The system of one or more embodiments advantageously permits the user to choose between crystalline versus amorphous selectivity, or amorphous versus crystalline selectivity. In one or more embodiments, provided is methods of etching amorphous layers while not-etching crystalline layers. In other embodiments, etching crystalline layers while not-etching amorphous layers is provided.

The embodiments of the disclosure are described by way of the Figures, which illustrate processes for forming nFET.

FIG. 1 illustrates a process flow diagram of method 10 of manufacturing an electronic device in accordance with one or more embodiments of the present disclosure. With reference to FIG. 1, the method begins at operation 15 by providing a substrate. As used herein, the term "provided" means that the substrate is made available for processing (e.g., positioned in a processing chamber). At operation 20, an amorphous silicon layer is deposited non-selectively on a top surface and a sidewall surface of at least one feature on the substrate and a crystalline silicon layer is deposited non-selectively on a bottom surface of the at least one feature. At operation 25, the amorphous silicon layer is selectively removed from the top surface and the sidewall surface of the at least one feature.

Figure 2:
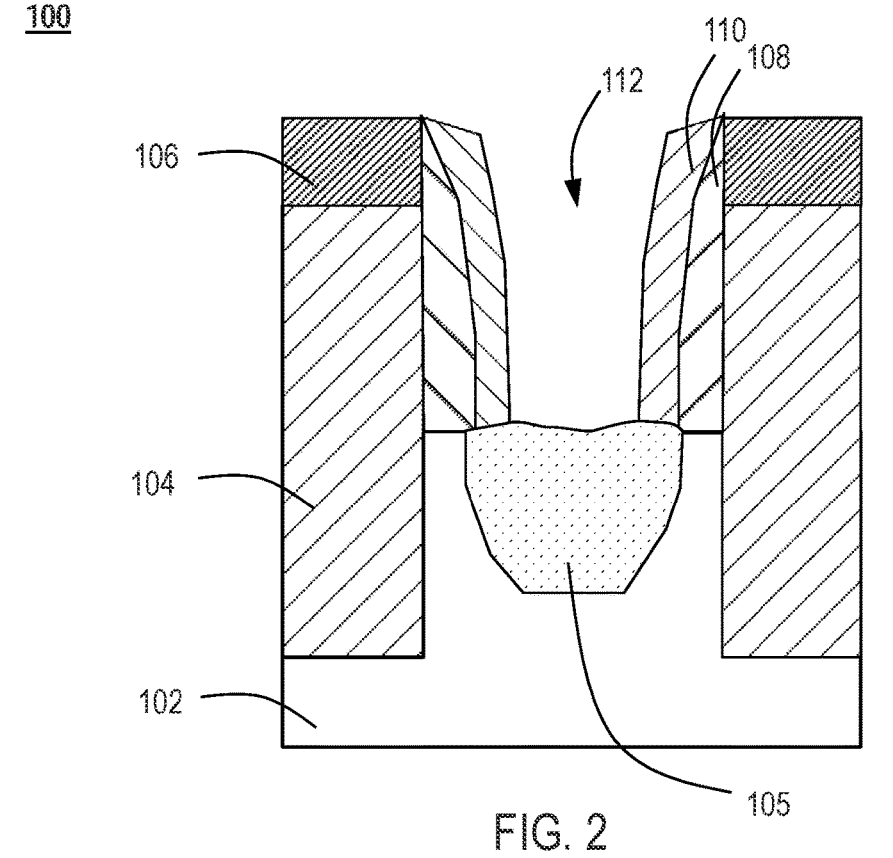
FIG. 2 illustrates a semiconductor structure in accordance with one or more embodiments of the disclosure.
Figure 3:
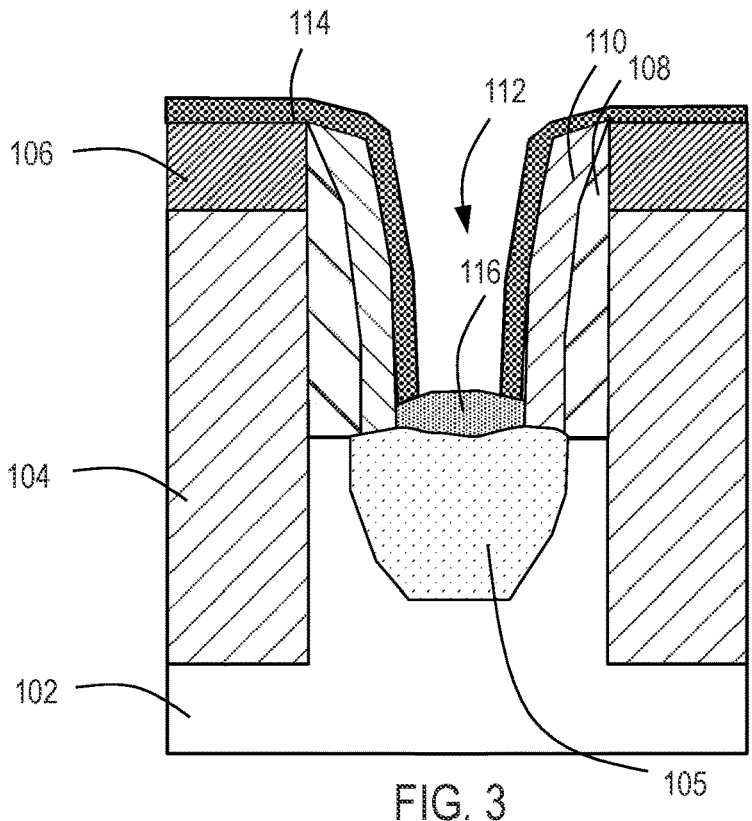
FIG. 3 illustrates a semiconductor structure in accordance with one or more embodiments of the disclosure.
Figure 4:
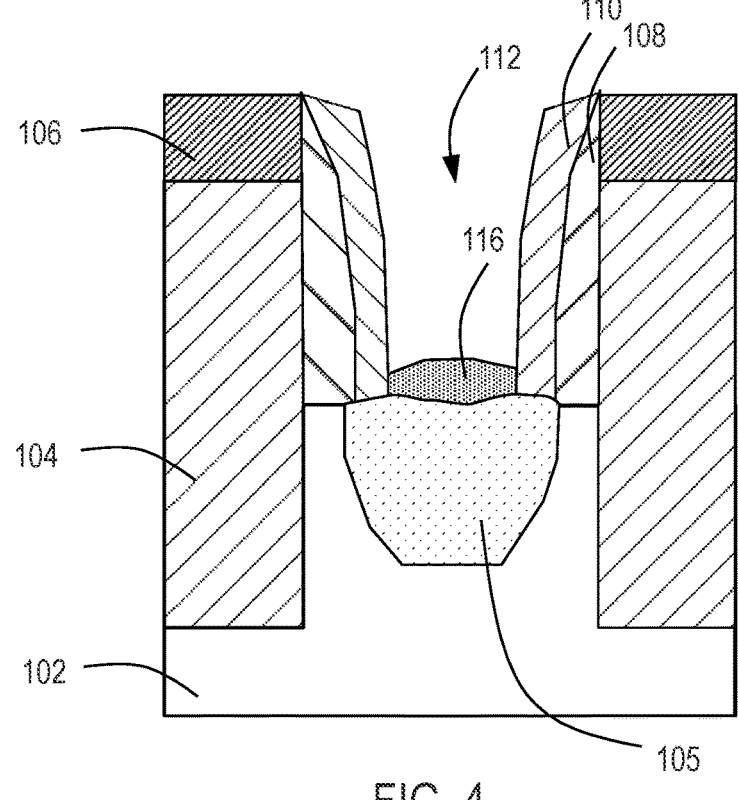
FIG. 4 illustrates a semiconductor structure in accordance with one or more embodiments of the disclosure.

FIGS. 2-4 are cross-sectional views of an electronic device (e.g., a transistor such as a FinFET or GAA) 100 according to one or more embodiments. The electronic devices 100 shown in FIGS. 2-4 may be manufactured by the method 10 illustrated in FIG. 1.

In one or more embodiments, the electronic device 100 comprises a semiconductor substrate 102. Semiconductor substrate 102 can be any suitable substrate material. In one or more embodiments, the semiconductor substrate 102 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), other semiconductor materials, or any combination thereof. In one or more embodiments, the semiconductor substrate 102 comprises one or more of silicon (Si), germanium (Ge), gallium (Ga), arsenic (As), indium (In), phosphorus (P), or selenium (Se). Although a few examples of materials from which the substrate 102 may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present disclosure.

In one or more embodiments, the semiconductor substrate 102 is a p-type or n-type substrate. As used herein, the term "n-type" refers to semiconductors that are created by doping an intrinsic semiconductor with an electron donor element during manufacture. The term n-type comes from the negative charge of the electron. In n-type semiconductors, electrons are the majority carriers and holes are the minority carriers. As used herein, the term "p-type" refers to the positive charge of a well (or hole). As opposed to n-type semiconductors, p-type semiconductors have a larger hole concentration than electron concentration. In p-type semiconductors, holes are the majority carriers and electrons are the minority carriers. In one or more embodiments, the semiconductor substrate 102 is an n-type substrate.

In one or more embodiments, a source/drain region 105 is on the top surface of the semiconductor substrate 102. In one or more embodiments, the source/drain region 105 can be any suitable material known to the skilled artisan. In one or more embodiments, the source/drain region 105 may have more than one layer. For example, the source/drain region 105 may independently comprise three layers. In one or more embodiments, the source/drain region 105 may independently comprise one or more of copper (Cu), cobalt (Co), tungsten (W), titanium (Ti), molybdenum (Mo), nickel (Ni), ruthenium (Ru), silver (Ag), gold (Au), iridium (Ir), platinum (Pt), phosphorus (P), germanium (Ge), silicon (Si), aluminum (Al), or zirconium (Zr). In some embodiments, the source/drain region 105 and may independently comprise a bottom layer of silicon with doped epi (e.g., SiGe, SiP, and the like), a second layer of silicide, which may contain nickel (Ni), titanium (Ti), aluminum (Al), and the like, and a third, or top, layer which may be a metal such as, but not limited to, cobalt, tungsten, ruthenium, and the like. In some embodiments, the source/drain region 105 may be raised source/drain regions formed by EPI growth.

In one or more embodiments, the source/drain material 105 may have more than one layer. In some embodiments, the source/drain material 105 comprises a layer of silicon with doped epi (e.g., SiGe, SiP, and the like), a second layer of silicide, which may contain nickel (Ni), titanium (Ti), aluminum (Al), and the like, and a third, or top, layer which may be a metal such as, but not limited to, cobalt, tungsten, ruthenium, and the like.

In one or more specific embodiments, the source/drain material 105 is of an n transistor and comprises silicon (Si) doped with phosphorous (P). In one or more embodiments, the source/drain material 105 of the n transistor 102 has a bandgap in a range of about 1.0 eV to about 1.2 eV.

FIGS. 2-4 show substrate 102 having a single feature 112 for illustrative purposes; however, those skilled in the art will understand that there can be more than one feature. The shape of the feature 112 can be any suitable shape including, but not limited to, trenches and cylindrical vias. As used in this regard, the term "feature" means any intentional surface irregularity. Suitable examples of features include, but are not limited to, trenches which have a top, two sidewalls and a bottom, peaks which have a top and two sidewalls. Features can have any suitable aspect ratio (ratio of the depth of the feature to the width of the feature). In some embodiments, the aspect ratio is greater than or equal to about 5:1, 10:1, 15:1, 20:1, 25:1, 30:1, 35:1 or 40:1.

In one or more embodiments, the substrate 102 has a substrate surface. The at least one feature 112 forms an opening in the substrate surface. The at least one feature 112 extends from the substrate surface to a feature depth to a bottom surface. The at least one feature 112 has a first sidewall and a second sidewall that define a width W of the at least one feature 112. The open area formed by the sidewalls and bottom are also referred to as a gap. In one or more embodiments, the width W is homogenous along the depth of the at least one feature 112. In other embodiments, the width, W, is greater at the top of the at least one feature 112 than the width, W, at the bottom surface of the at least one feature 112.

In one or more embodiments, the at least one feature 112 comprises a source/drain trench. The first sidewall and the second sidewall may comprise one or more of a replacement metal gate 104, dielectric gate cap 106, gate liner 108, and low-K spacer 110. In one or more embodiments, the replacement metal gate 104 includes high-K dielectric and metal layers required to set the metal gate work-function. In one or more embodiments, the dielectric gate cap 106 offers protection of the metal gate layers versus polishing and plasma etch steps. The dielectric gate cap 106 may comprise any suitable dielectric material known to the skilled artisan. In one or more embodiments, the dielectric gate cap 106 includes, but is not limited to, silicon nitride (SiN) or silicon oxide ($SiO_x$). In one or more embodiments, the gate liner 110 comprises a thin silicon oxide or silicon nitride. In one or more embodiments, the low-k spacer 110 comprises one or more of silicon oxycarbonitride (SiOCN), boron doped silicon oxycarbonitride (SiOCBN), and silicon oxynitride (SiON).

Referring to FIG. 3, in one or more embodiments an amorphous silicon layer 114 is non-selectively deposited on a top surface and a sidewall surface of at least one contact trench 112 on the substrate 102. In one or more embodiments, a crystalline silicon layer 116 is non-selectively deposited on the bottom surface of the at least one contact trench 112, the bottom surface including a source/drain material 105. In one or more embodiments, the non-selective deposition occurs at a temperature less than or equal to 400° C. In other embodiments, the non-selective deposition occurs at a temperature in a range of from 0° C. to less than or equal to 400° C., including in a range of from 0° C. to 375° C., or a range of from 10° C. to 350° C., or in a range of from 350° C. to 400° C.

In one or more specific embodiments, the amorphous silicon layer 114 is doped with an n-type dopant. In one or more embodiments, the n-type dopant comprises phosphorus (P). Thus, in one or more embodiments, the amorphous silicon layer 114 comprises silicon (Si) doped with phosphorous (P), or silicon phosphorus (SiP). In one or more specific embodiments, the crystalline silicon layer 116 is doped with an n-type dopant. In one or more embodiments, the n-type dopant comprises phosphorus (P). Thus, in one or more embodiments, the crystalline silicon layer 116 comprises silicon (Si) doped with phosphorous (P), or silicon phosphorus (SiP), silicon doped with arsenic (As), silicon doped with antimony (Sb).

With reference to FIG. 4, in one or more embodiments, the amorphous silicon layer 114 is selectively removed from the top surface and the sidewall surface of the contact trench 112, while the crystalline silicon layer 116 remains on the source/drain region 105. In one or more embodiments, the amorphous silicon layer 114 is selectively removed at a temperature less than or equal to 400° C. In one or more embodiments, the amorphous silicon layer 114 is selectively removed at a temperature in a range of from 50° C. to 200° C. In one or more embodiments, the amorphous silicon layer 114 is selectively removed at a temperature in a range of from 0° C. to 20° C.

The amorphous silicon layer 114 may be removed at any suitable pressure and power. In some embodiments, the selective removal of the amorphous crystalline layer is performed at a pressure in a range of from 1 Torr to 10 Torr and at a power in a range of from 100 W to 500 W.

In one or more embodiments, the amorphous silicon layer 114 may be selectively removed by any suitable means known to the skilled artisan. In one or more embodiments, the amorphous silicon layer 114 is selectively removed by etching with a gas stream comprising a mixture of hydrogen ($H_2$) and ammonium fluoride ($NF_3$) flowing over the substrate. In other embodiments, selective removal comprises etching with a gas stream comprising a mixture of ammonium fluoride ($NF_3$), helium (He), and argon (Ar) over the substrate.

In one or more specific embodiments, the amorphous silicon layer 114 is selectively removed at a temperature in a range of from 50° C. to 200° C., at a pressure in a range of from 1 Torr to 10 Torr, and at a power in a range of from 100 W to 500 W, where selective removal comprises etching with a gas stream comprising a mixture of hydrogen ($H_2$) and ammonium fluoride ($NF_3$) over the substrate.

In other specific embodiments, the amorphous silicon layer 114 is selectively removed at a temperature in a range of from 0° C. to 20° C., at a pressure in a range of from 1 Torr to 10 Torr, and at a power in a range of from 100 W to 500 W, where selective removal comprises etching with a gas stream comprising a mixture of ammonium fluoride ($NF_3$), helium (He), and argon (Ar) over the substrate.

The amorphous silicon layer 114 can be removed using any suitable removal technique known to the skilled artisan, including, but not limited to, wet etching, vapor etching, isotropic plasma etch, or any other Selective Removal Process (SRP). In one or more embodiments, the amorphous silicon layer 114 is removed with a selectivity ratio relative to the crystalline silicon layer 116 of a ratio in a range of from 2:1 to 20:1. Thus, in one or more embodiments, the etch rate of the amorphous silicon layer 114 compared to the etch rate of the crystalline silicon layer 116 is in a range of from two times faster (2:1) to twenty times faster (20:1).

In one or more embodiments, the method is performed in a processing chamber without breaking vacuum. Thus, the non-selective deposition and the selective removal process are performed in a processing chamber without breaking vacuum.

The process can then proceed according to standard procedure with the formation of a source/drain contact on the crystalline silicon layer 116. In one or more embodiments, the source/drain contact may independently be selected from one or more of nitrogen (N), copper (Cu), cobalt (Co), tungsten (W), titanium (Ti), molybdenum (Mo), nickel (Ni), ruthenium (Ru), silver (Ag), gold (Au), iridium (Ir), tantalum (Ta), or platinum (Pt). In one or more embodiments, formation of the source contact and/or the drain contact is conducted by any suitable process known to the skilled artisan, including, but not limited to ALD, CVD, PVD, MBE, MOCVD, spin-on, or other insulating layer deposition techniques known to the skilled artisan.

Figure 5:
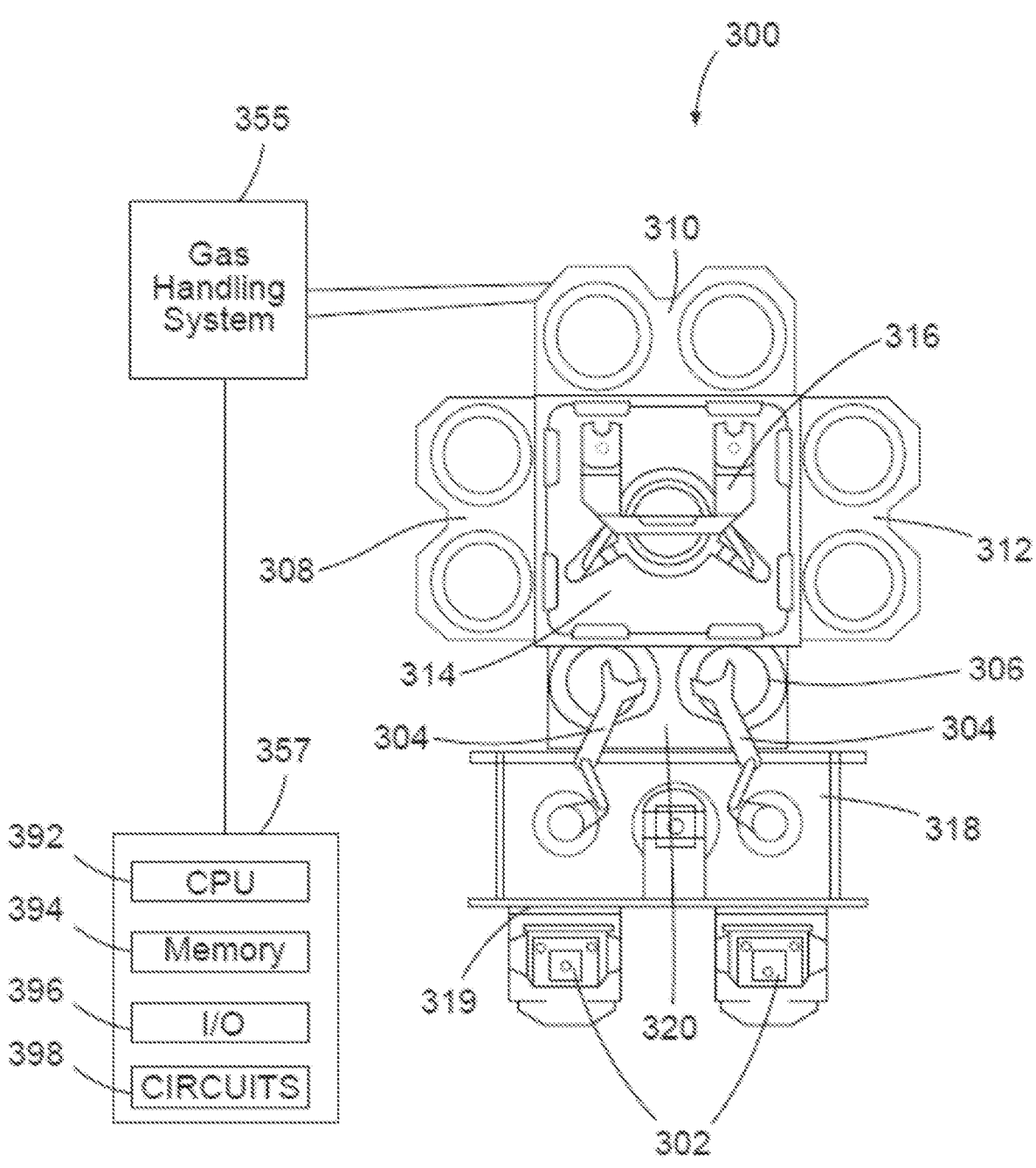
FIG. 5 illustrates a cluster tool in accordance with one or more embodiments of the disclosure.

Additional embodiments of the disclosure are directed to processing tools 300 for the formation of the GAA devices and methods described, as shown in FIG. 5. A variety of multi-processing platforms, including the Reflexion® CMP, Selectra® Etch, Centura®, Dual ACP, Producer® GT, and Endura® platform, available from Applied Materials® as well as other processing systems may be utilized. The cluster tool 300 includes at least one central transfer station 314 with a plurality of sides. A robot 316 is positioned within the central transfer station 314 and is configured to move a robot blade and a wafer to each of the plurality of sides.

The cluster tool 300 comprises a plurality of processing chambers 308, 310, and 312, also referred to as process stations, connected to the central transfer station. The various processing chambers provide separate processing regions isolated from adjacent process stations. The processing chamber can be any suitable chamber including, but not limited to, a pre-clean chamber, a non-selective deposition chamber, a selective removal chamber, and the like. The particular arrangement of process chambers and components can be varied depending on the cluster tool and should not be taken as limiting the scope of the disclosure. In one or more embodiments, the non-selective deposition chamber and the selective etching chamber are continuously kept under vacuum.

In the embodiment shown in FIG. 5, a factory interface 318 is connected to a front of the cluster tool 300. The factory interface 318 includes chambers 302 for loading and unloading on a front 319 of the factory interface 318.

The size and shape of the loading chamber and unloading chamber 302 can vary depending on, for example, the substrates being processed in the cluster tool 300. In the embodiment shown, the loading chamber and unloading chamber 302 are sized to hold a wafer cassette with a plurality of wafers positioned within the cassette.

Robots 304 are within the factory interface 318 and can move between the loading and unloading chambers 302. The robots 304 are capable of transferring a wafer from a cassette in the loading chamber 302 through the factory interface 318 to load lock chamber 320. The robots 304 are also capable of transferring a wafer from the load lock chamber 320 through the factory interface 318 to a cassette in the unloading chamber 302.

The robot 316 of some embodiments is a multi-arm robot capable of independently moving more than one wafer at a time. The robot 316 is configured to move wafers between the chambers around the transfer chamber 314. Individual wafers are carried upon a wafer transport blade that is located at a distal end of the first robotic mechanism.

A system controller 357 is in communication with the robot 316, and a plurality of processing chambers 308, 310 and 312. The system controller 357 can be any suitable component that can control the processing chambers and robots. For example, the system controller 357 can be a computer including a central processing unit (CPU) 392, memory 394, inputs/outputs 396, suitable circuits 398, and storage.

Processes may generally be stored in the memory of the system controller 357 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general-purpose computer into a specific purpose computer (controller) that controls the chamber operation such that the processes are performed.

In some embodiments, the system controller 357 has a configuration to control the non-selective deposition chamber to deposit the amorphous silicon layer and the crystalline silicon layer.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising a pre-clean chamber, a non-selective deposition chamber, a selective removal chamber, and the like; and a controller connected to the central transfer station and the plurality of process stations, the controller configured to activate the robot to move the wafer between process stations, and to control a process occurring in each of the process stations.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods, and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a semiconductor device, the method comprising:

non-selectively depositing an amorphous silicon layer on a top surface of a first dielectric material and on a sidewall surface of a second dielectric material of at least one feature on a substrate and a crystalline silicon layer on a bottom surface of the at least one feature at a first temperature less than or equal to 400° C., the bottom surface comprising a metal layer on a metal silicide layer on a doped silicon layer on the substrate; and selectively removing the amorphous silicon layer from the top surface and from the sidewall surface at a second temperature in a range of from 50° C. to 200° C., wherein the method is performed in a processing chamber without breaking vacuum.

2. The method of claim 1, wherein the selectively removing is performed at a pressure in a range of from 1 Torr to 10 Torr.

3. The method of claim 2, wherein the selectively removing comprises etching with a gas stream comprising a mixture of hydrogen ($H_2$) and ammonium fluoride ($NF_3$) over the substrate.

4. The method of claim 1, wherein the selectively removing is selective to the amorphous silicon layer in a ratio in a range of 2:1 to 20:1.

5. The method of claim 1, wherein one or more of the amorphous silicon layer and crystalline silicon layer is doped with a n-type dopant.

6. The method of claim 5, wherein the n-type dopant comprises phosphorus (P).

7. The method of claim 1, wherein the first dielectric material comprises silicon nitride (SiN) or silicon oxide ($SiO_x$) and the second dielectric material comprises one or more of silicon oxycarbonitride (SiOCN), boron doped silicon oxycarbonitride (SiOCBN), or silicon oxynitride (SiON).

8. A method of forming a logic device, the method comprising:

non-selectively depositing an amorphous silicon layer on a top surface of a first dielectric material and a sidewall surface of a second dielectric material of at least one contact trench on a substrate and a crystalline silicon layer on a bottom surface of the at least one contact trench at a first temperature less than or equal to 400° C., the bottom surface including a source/drain material comprising a metal layer on a metal silicide layer on a doped silicon layer on the substrate; and selectively removing the amorphous silicon layer from the top surface and the sidewall surface at a second temperature is in a range of from 50° C. to 200° C., wherein the method is performed in a processing chamber without breaking vacuum.

9. The method of claim 8, wherein the selectively removing is performed at a pressure in a range of from 1 Torr to 10 Torr.

10. The method of claim 9, wherein the selectively removing comprises etching with a gas stream comprising a mixture of hydrogen ($H_2$) and ammonium fluoride ($NF_3$) over the substrate.

11. The method of claim 8, wherein the selectively removing is selective to the amorphous silicon layer in a ratio in a range of 2:1 to 20:1.

12. The method of claim 8, wherein one or more of the amorphous silicon layer and crystalline silicon layer is doped with a n-type dopant.

13. The method of claim 12, wherein the n-type dopant comprises phosphorus (P).

14. The method of claim 8, wherein the logic device comprises an nMOS.

15. The method of claim 8, wherein the first dielectric material comprises silicon nitride (SiN) or silicon oxide ($SiO_x$) and the second dielectric material comprises one or more of silicon oxycarbonitride (SiOCN), boron doped silicon oxycarbonitride (SiOCBN), or silicon oxynitride (SiON).

* * * * *